United States Patent [19]

Smith et al.

[11] Patent Number: 5,036,379
[45] Date of Patent: * Jul. 30, 1991

[54] ELECTRICAL INTERCONNECT TAPE

[75] Inventors: Robert T. Smith, Round Rock; Chang-Hwa Chung, Austin, both of Tex.

[73] Assignee: Microelectronics and Computer Technology Corporation, Austin, Tex.

[*] Notice: The portion of the term of this patent subsequent to Aug. 22, 2006 has been disclaimed.

[21] Appl. No.: 371,946

[22] Filed: Jun. 27, 1989

Related U.S. Application Data

[63] Continuation-in-part of Ser. No. 96,866, Sep. 14, 1987.

[30] Foreign Application Priority Data

Oct. 11, 1986 [GB] United Kingdom ................. 8626828

[51] Int. Cl.$^5$ ......................................... H01L 23/495
[52] U.S. Cl. ...................................... 357/69; 357/70; 357/65; 174/117 FF
[58] Field of Search .......................... 357/69, 79, 65; 174/117, 117 FF

[56] References Cited

U.S. PATENT DOCUMENTS

| | | | |
|---|---|---|---|
| 3,239,916 | 3/1966 | Love | 29/155.5 |
| 3,740,678 | 6/1973 | Yates | 333/84 M |
| 3,818,117 | 6/1974 | Reyner, II | 174/117 FF |
| 4,014,015 | 3/1977 | Gundlach | 340/347 P |
| 4,064,552 | 12/1977 | Angelucci et al. | 361/414 |
| 4,289,364 | 9/1981 | Strom et al. | 339/17 CF |
| 4,358,785 | 11/1982 | Takagami et al. | 357/79 |
| 4,363,988 | 12/1982 | Kliman | 310/268 |
| 4,635,359 | 1/1987 | Nozick | 174/117 FF |
| 4,694,123 | 9/1987 | Massey | 174/117 FF |
| 4,814,855 | 3/1989 | Hodgson et al. | 357/71 |
| 4,860,088 | 8/1989 | Smith et al. | 357/69 |
| 4,888,665 | 12/1989 | Smith | 361/400 |

OTHER PUBLICATIONS

Brochure, "KD-2700 Series Alignment System" by Kaman Instrumentation Corp. (1982).
Brochure, "MAS/400 & MAS/500 Series Mask Aligners" by Research Devices, a division of American Optical Corp.
R. Prasad, "Surface Mount Technology—Principles and Practice", Van Nostrand Reinhold, New York, p. 398 (1989).

Primary Examiner—Andrew J. James
Assistant Examiner—Viet Q. Nguyen
Attorney, Agent, or Firm—David M. Sigmond

[57] ABSTRACT

A flexible beam lead tape having three layers having trace conductors, a dielectric and a ground plane. Vias extend through the dielectric layer at the first and second ends of the electrical conductors for providing versatile connections to either ends of the conductors. The ends of the conductors may be provided with electrical connections on either or both sides of the tape and may be connected by pressure contact or by bonding. The tape also includes means for aligning the tape with a substrate to which the tape will be interconnected.

20 Claims, 8 Drawing Sheets

ELECTRICAL INTERCONNECT TAPE

This application is a continuation-in-part of U.S. Ser. No. 07/096,866, filed Sept. 14, 1987, and entitled "Electrical Interconnect Tape."

BACKGROUND OF THE INVENTION

The present invention is directed to a flexible three layer tape which is capable of interconnecting a variety of substrate and printed circuit board electrical members. The present interconnect tape may connect two electrical members together in a wide variety of configurations, such as interconnects for card cages and mother-daughter boards.

The present interconnect tape is versatile in its use and can be electrically interconnected by pressure contacts or by bonding. The structure of the present tape has the advantage of being connectable on either or both sides and can be made in frame format in arbitrary lengths as the repetitive pattern does not require a defined frame length along the tape.

SUMMARY

One feature of the present invention is the provision of an electrical interconnect tape for connecting two members and includes a flexible beam tape having a first layer of electrical conductors having first and second ends, a middle layer of a dielectric, and a third ground layer. A plurality of vias extend through the dielectric layer at the second ends of the electric conductors. Each of the vias is adjacent to one of the second ends of the electrical conductors for allowing bonds to the conductors from either side of the tape and for providing a versatile programmable interconnect.

The present invention is also directed to an electrical interconnect tape for connecting two electrical members and includes a flexible beam lead tape having a first layer of electrical conductors having first and second ends, a middle layer of a dielectric material, and a third electrical ground layer. Vias extend through the dielectric layer at the first and second ends of the electrical conductors thereby allowing various types of electrical connections to be made to each end and also allow the connections to be made to the electrical conductors through either side or, if desired, through both sides of the tape.

A still further object of the present invention is the provision of a raised electrical contact on the dielectric on the side having the first layer. These electrical contacts may be enlarged pressure contacts. A back-up bump on the dielectric extending to the side having the third layer is connected through a via to each of the raised electrical contacts. The back-up bumps by extending through the opposing tape surface promote a concentrated normal pressure contact force on the contact area.

Still a further object of the present invention is wherein the back-up bumps are electrically conductive for providing an electrical connection on either side of the tape to the first ends of the conductors. The back-up bumps may extend outwardly from the tape beyond the third layer for being acted upon by a suitable pressure generating means for forcing the electrical contacts into pressure engagement with an electrical member.

Yet a still further object of the present invention is the provision of an electrical connection between at least one of the ends of the electrical conductors and the ground layer through a via which allows a programmable choice of a signal/ground return ratio.

Still a further object of the present invention is wherein an electrical connection may be made to the second ends of the electrical conductors and has the capability of electrically connecting the second ends to an electrical member on either side of the tape.

Still a further object of the present invention is wherein the tape includes means for aligning the tape with the substrate to which the tape is to be connected. The alignment means may be suitable for mechanical alignment, energy source alignment, or both. Numerous types of fiduciary marks can be used for alignment.

Other objects, features and advantages will be apparent from the following description of presently preferred embodiments of the invention, given for the purpose of disclosure, and taken in conjunction with the accompanying drawings.

DESCRIPTION OF THE PREFERRED EMBODIMENT

Figure 1:
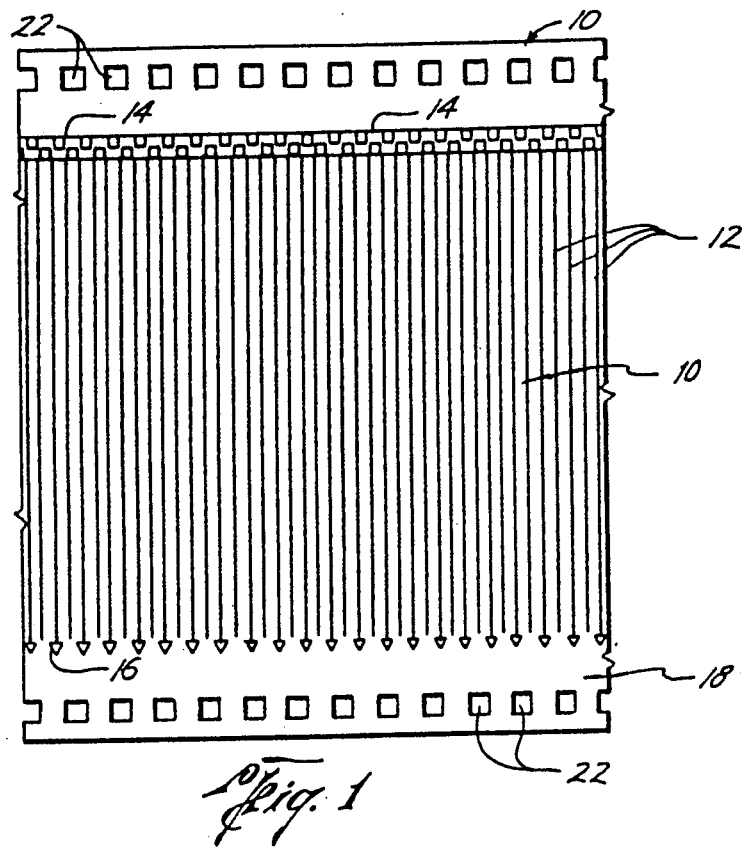
FIG. 1 is a fragmentary elevational schematic view of one embodiment of the present invention as fabricated on a 70 mm tape format.

The present invention is directed to a flexible beam lead tape for providing a high density wide band width interconnect. Referring now to FIG. 1, the flexible tape is generally indicated by the reference numeral 10 and has a first layer 12 consisting of a plurality of electrical connectors 12 or traces each having a first end 14 and a second end 16 extending across the tape 10. The tape 10 includes a middle layer 18 of a dielectric and a third electrical ground layer 20. By way of example, in the embodiment shown in FIG. 1 the tape is in a 70 mm format in arbitrary lengths and includes sprocket holes or perforations 22 which may be utilized as means for alignment. While any suitable materials can be used, preferably the dielectric is polyimide or Teflon and the electrical conductors 12 and ground plane 20 are copper.

For purposes of illustration only, a description of an embodiment having specific geometry and sizes will be given, but it is to be understood that the flexible tape interconnect may use other geometry and sizes.

Figure 2:
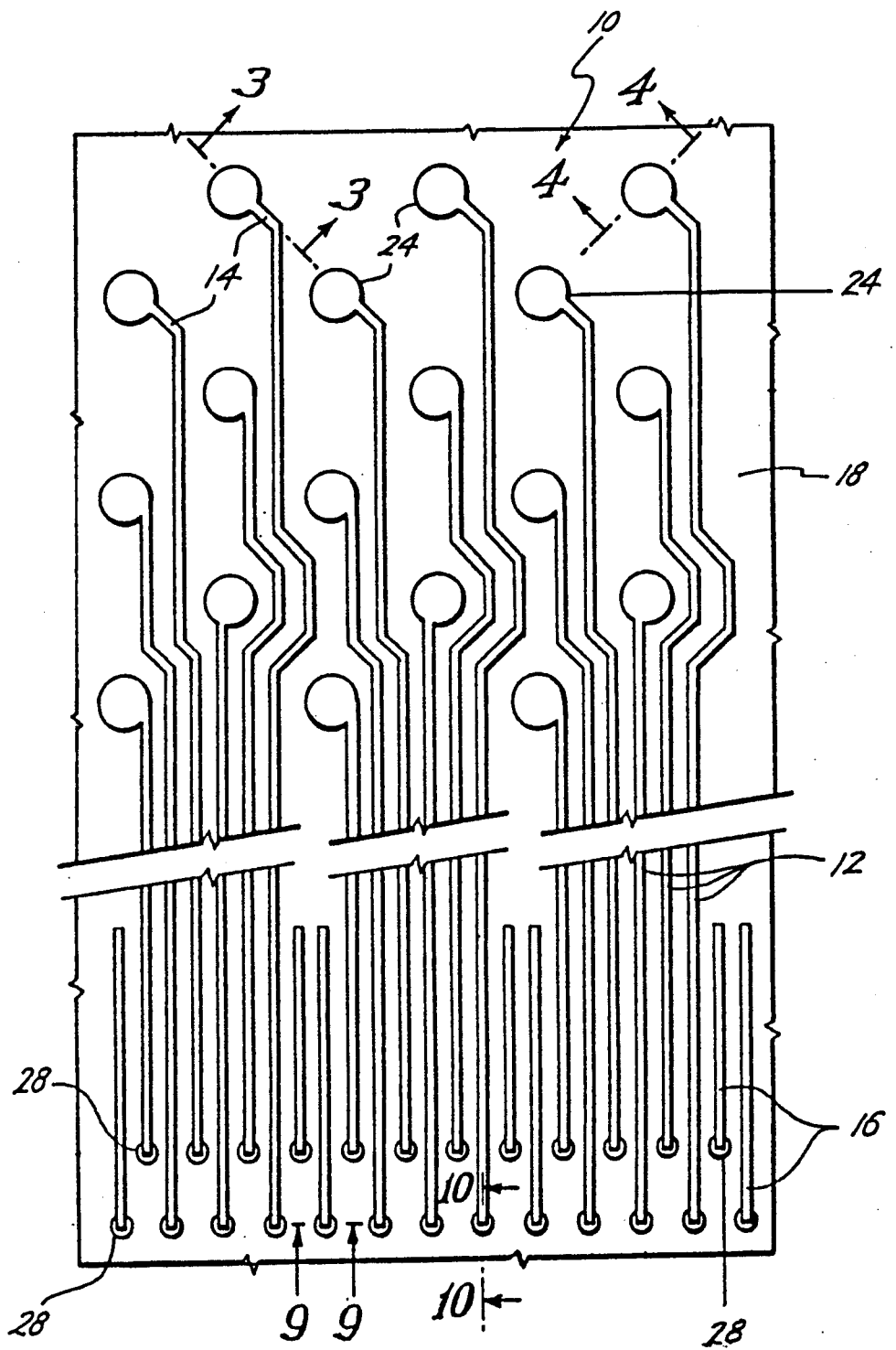
FIG. 2 is an enlarged fragmentary elevational view of the apparatus in FIG. 1.

Referring now to FIG. 2, the electrical conductors 12 or circuit element traces are incorporated as microstrip transmission lines, for example, of approximately 50 ohm characteristic impedance. A wide range of characteric impedances may be selected, governed by geometry and dielectric constant. The trace geometry may be as follows: trace width 2 mil, trace thickness 0.7 mil ($\frac{1}{2}$ oz. copper), trace center to center separation is 5 mil and the trace electrical conductors 12 are separated from the ground plane 20 by 1 mil of polyimide. At the first end 14 of the microstrip traces 12, 10 mil diameter plated up pads 24 are provided, located over 6 mil filled vias 26 (FIGS. 3 and 4) in a 40 mil face-center grid pattern which has an effective area contact density exceeding 1000 contacts per square inch.

At the second end 16 two rows of 6 mil diameter vias 28 are provided. The vias 28 (FIGS. 9 and 10) in each row are on 10 mil centers and the rows are separated by 15 mil giving an effective 5 mil center-to-center spacing. The ends 16 of the electrical conductors 12 are suspended in the vias 28.

The vias 26 and 28 provide versatility to the interconnect 10 by allowing various methods of connection to the traces 12 to be achieved and also allow the electrical connections to be made to the ends 14 and 16 from either side of the interconnect 10. The existence of the ground plane 20 defines a controlled impedance for all of the conductive traces 12. The vias 26 and 28 also allow a programmable choice of the signal/ground return ratio by permitting connection of the ground plane 20 to a selected trace or traces 12. The three layer tape construction (trace metal, dielectric, ground plane) due to the use of the vias 26 and 28, can be made in a suitable format in arbitrary lengths as the pattern geometry does not require a defined frame length along the tape 10. That is, the trace pattern 12 is replicated on 5 mil centers continuously along the tape 10.

Figure 3:
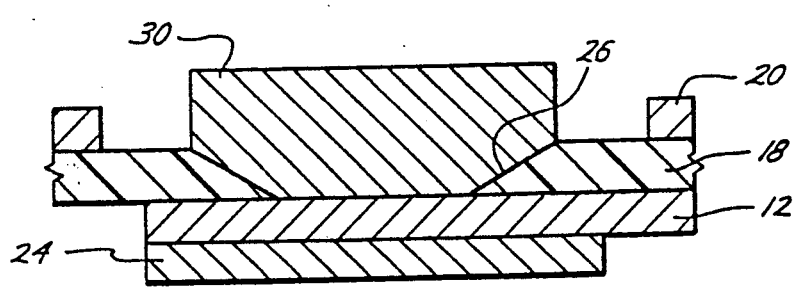
FIG. 3 is an upsidedown cross-sectional view taken along the line 3—3 of FIG. 2.
Figure 4:
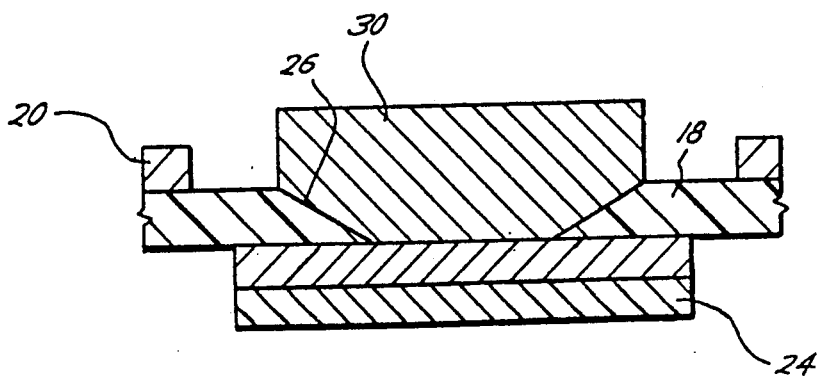
FIG. 4 is an upsidedown cross-sectional view taken along the line 4—4 of FIG. 2.

Referring now to FIGS. 2, 3 and 4, the plated up pads 24 are particularly useful for use as pressure contacts which are connected to the first ends 14 of the electrical conductors 12. The use of the vias 26 allows the plated up pads 24, which may be copper overlayed with gold to be backed up and supported. That is, on the back side of the dielectric 18 the vias 26 are filled with a back-up bump of metal 30, such as by plating with copper, so that the back-up bump 30 extends, for example, 1 mil beyond the back surface of the dielectric 18. The filled via 26 and back-up bump 30 provides a back-up support for the contact 24 for allowing the contact 24 to be connected to an electrical member by pressure contact. That is, suitable pressure contacting means engages the back of the back-up bump 30, such as cams, springs, bolts, or other clamping devices. The filled via 26 and back-up bump 30 provide a back-up support for making a good electrical contact with the pad 24 by concentration of a normal force directly on the contact 24.

Figure 5:
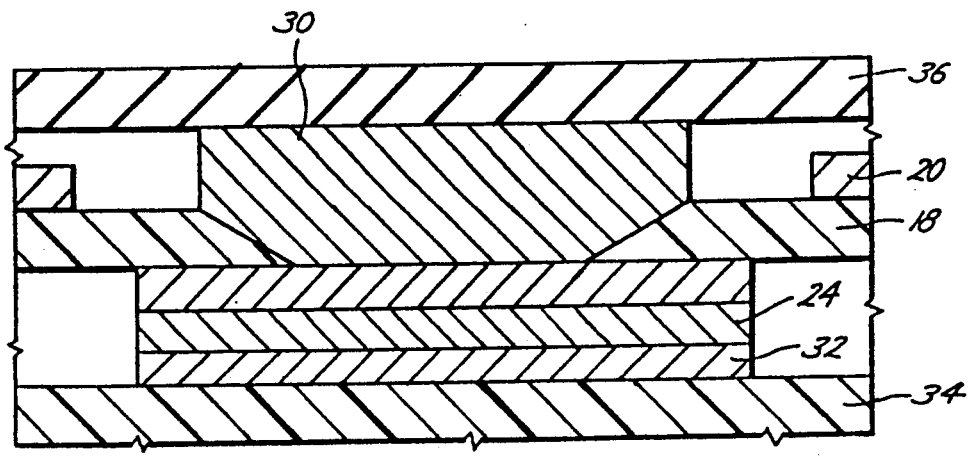
FIG. 5 is a cross-sectional view similar to FIG. 3 illustrating one type of electrical connection that can be made with the structure of FIGS. 3 and 4.

Referring now to FIG. 5, the structure of FIGS. 3 and 4 is shown in which the electrical contact 24 is urged against a main board contact 32 on a main board substrate 34 by means of an elastomer 36 acting against the back-up bump 30.

Figure 6:
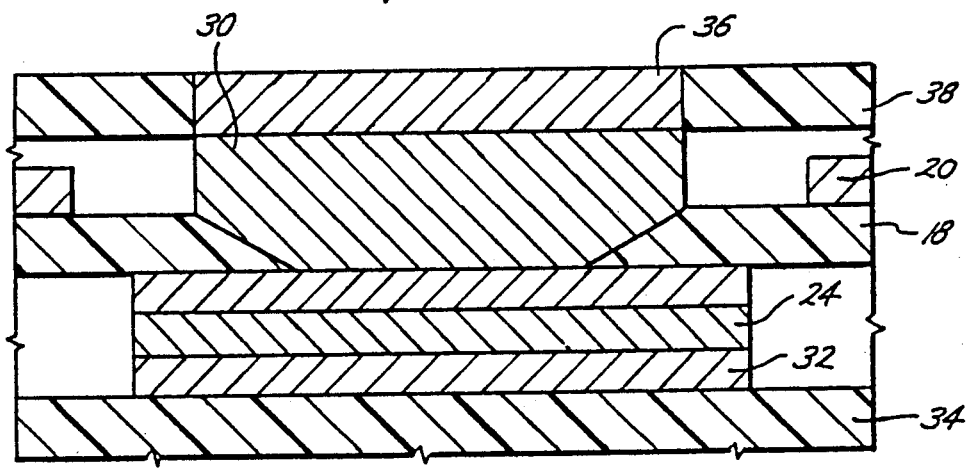
FIG. 6 is a cross-sectional view illustrating another type of electrical connection that may be made with the structure of FIGS. 3 and 4.

In addition, the structure of FIGS. 3 and 4 has utility, as best seen in FIG. 6, in applications where the contact 24 may be placed in electrical contact with a substrate contact 32 and/or on the back side to a via 36 in a multichip substrate 38.

Figure 7:
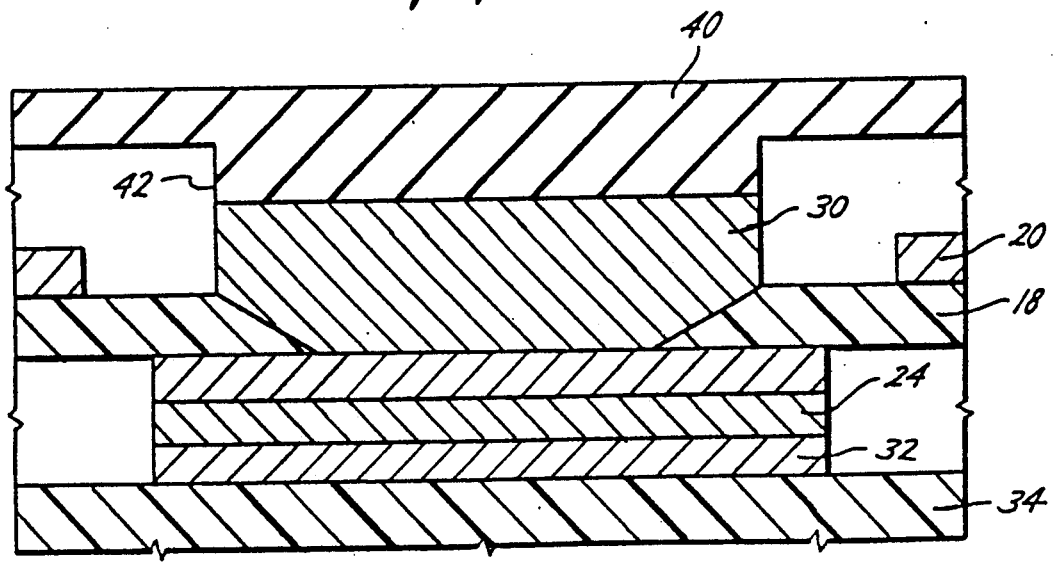
FIG. 7 is a cross-sectional view illustrating another method of pressure connecting the structure of FIGS. 3 and 4.
Figure 8:
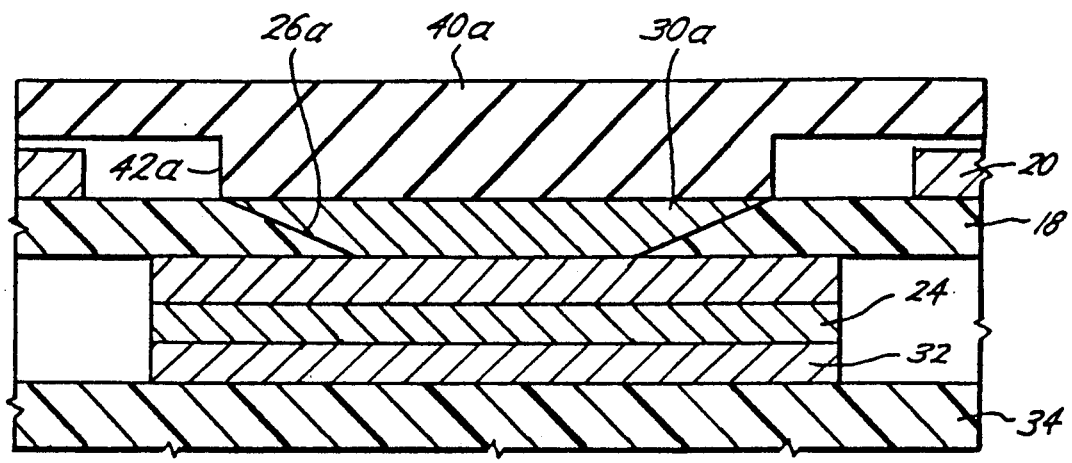
FIG. 8 is a cross-sectional view of another embodiment of a connection of one of the electrical conductors.

Referring now to FIG. 7, a variation of the application of contact pressure to the structure of FIGS. 3 and 4 is best seen. In this case a profiled elastomeric material 40 is used having a profile 42 in the configuration of an array of bumps, bosses or protuberances which are in registration with the back-up bump 30 and hence backs up the electrical connection between the contact 24 and main board contact 32. If desired, as best seen in FIG. 8, by suitably profiling the pressure providing pad 40a with a profile 42a the concentration of normal force on the individual contacts 24 is enhanced. The profile 42a eliminates the necessity for the filled via 26a to have a back-up bump 30a which protrudes outwardly past the ground plane 20 as was shown in FIG. 7.

Figure 9:
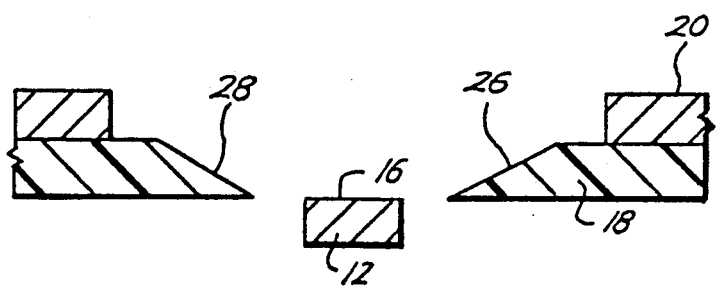
FIG. 9 is an upsidedown cross-sectional view taken along the line 9—9 of FIG. 2.
Figure 10:
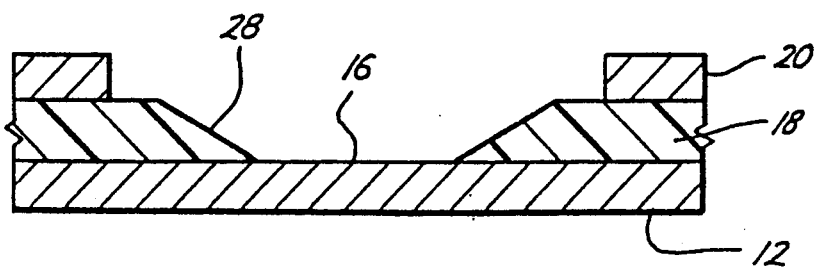
FIG. 10 is an upsidedown cross-sectional view taken along the line 10—10 of FIG. 2.
Figure 11:
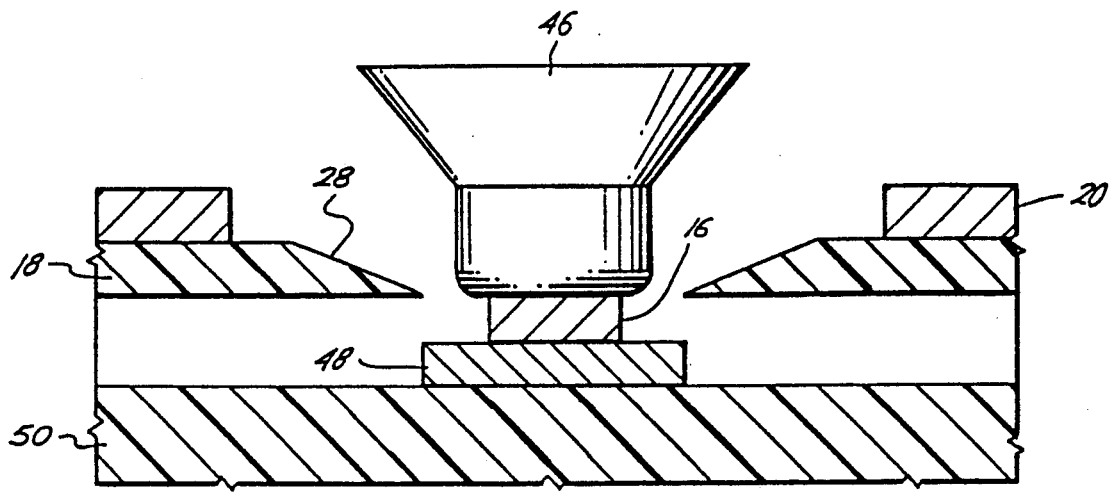
FIG. 11 is a cross-sectional view illustrating one method of bonding the electrical conductors of FIGS. 9 and 10 through one side of the tape.

Referring now to FIGS. 9 and 10, the second ends 16 of the traces 12 extend into a 6 mil diameter via 28. The vias 28 serve a number of purposes. First, the use of the double row of vias 28 on an effective 5 mil center permit the free ends 16 of the traces 12 to be used as bond sites to be individually supported enabling the tape 10 to be manufactured in a continuous pattern. Secondly, the bonding system can be adapted to accommodate various types of selectable programmable systems and thus provide a more versatile interconnect. As best seen in FIG. 11, the vias 28 permit thermosonic or thermocompression bonding by a tool 46 which can be positioned from the back side of the tape for bonding the ends 16 to a substrate contact 48 on a substrate 50.

Figure 12:
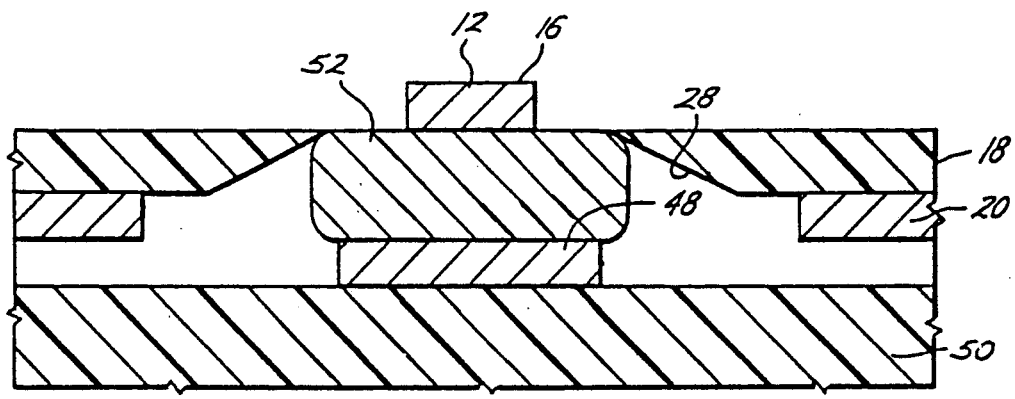
FIG. 12 is a cross-sectional view illustrating a method of bonding the electrical conductor from the reverse side of the tape.

In addition, as best seen in FIG. 12, the vias 28 permit attachment by suitable material 52 such as solder, epoxy or other materials. The via surfaces 28 in this case function as a dam, and an initiating process such as a focused laser beam can be impinged on the bonding site on the end 16 of the trace 12 from the trace side of the tape 10 thereby bonding the trace 12 to a metal contact 48 on the substrate 50.

Figure 13:
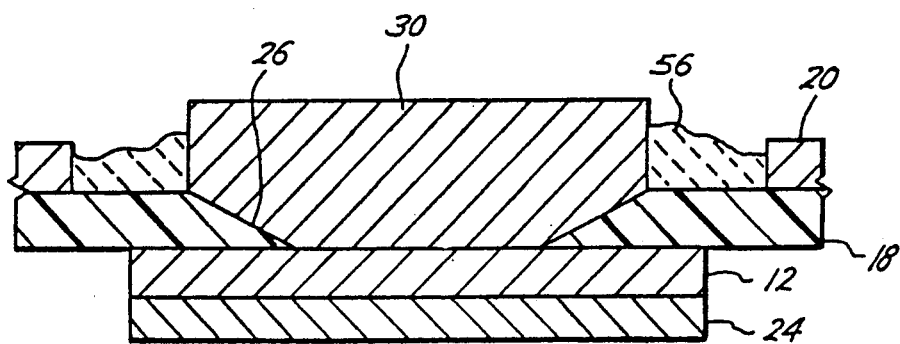
FIG. 13 illustrates one structure which may be used to connect the ground plane to the first end of an electrical conductor.

Furthermore, the incorporation of the via structures 26 and 28 in the tape 10 also allows a programmable selection of signal/ground return ratio. Referring now to FIG. 13, the structure of FIGS. 3 and 4 are shown in which a conductive material 56 such as a conductive epoxy, solder, or other conductive material is used and the appropriate via 26 for the selected trace 12 is merely overfilled with the material to a sufficient extent to cause a connection between the ground plane 20 and the back-up bump 30.

Figure 14:
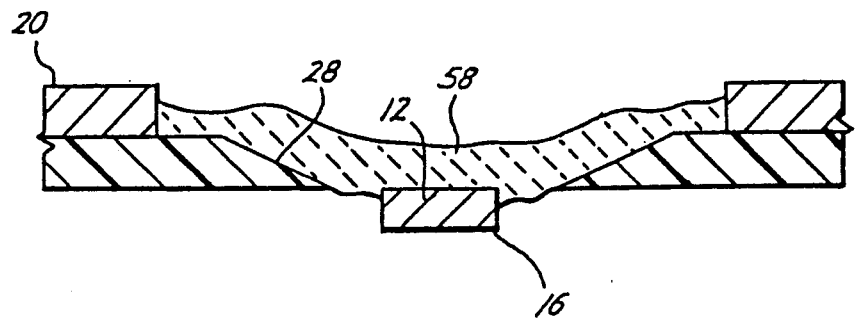
FIG. 14 is a cross-sectional view illustrating the connection of the ground plane to the second end of an electrical conductor, FIGS. 15A, 15B, 15C, 15D and 15E schematically illustrate various types of electrical members which may be interconnected by the present interconnect tape.

Similarly, the end 16 of one or more traces 12 may be suitably connected to the ground plane, as best seen in FIG. 14 by depositing a suitable conductive material 58 in the vias 28 to make a connection between the ground plane 20 and the end 16 of a selected trace 12.

Figure 15A:
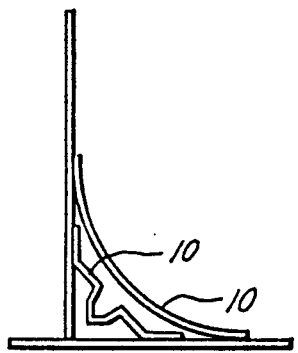
Figure 15B:
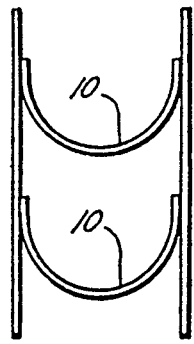
Figure 15C:
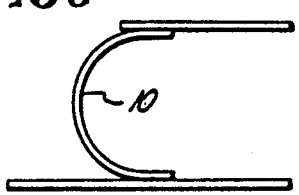
Figure 15D:
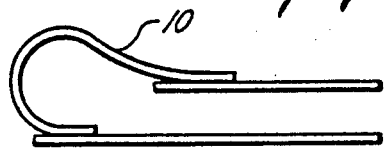
Figure 15E:

FIG. 15A, 15B, 15C, 15D and 15E illustrate how the flexible electrical interconnect tape 10 of the present invention may be used in a variety of substrate and printed circuit board interconnection arrangements. By appropriate design of the connector housing and pressure providing means, a wide variety of configurations can be accommodated including a connection between the parallel connections in FIG. 15B, 15C and 15D and the orthogonal board card cage shown in FIG. 15A and the mother-daughter board shown in FIG. 15E. In addition, by means of the bonding of multiple tapes 10 instead of one (two tapes are shown in FIG. 15A and 15B) effective contact densities in multiples of 200 per inch can be readily achieved.

While the embodiment shown in FIGS. 1 and 2 utilize pressure contacts at the end 14 and bonding contacts at the end 16, by the use of the vias 26 and 28, both ends of the tape could use pressure plated bump contacts 24 or both ends could be similar to ends 16 to incorporate the bond site permanent type of connection at both ends. The use of the three layer tape with the electrical connectors and vias at each end provide a layout which has great versatility and can be used in many different applications.

While the embodiment in FIG. 1 utilizes frame sprocket perforations 22 along the edges of the tape as the means for aligning the tape with the article to which the tape will be interconnected, it is to be understood that the flexible tape interconnect can use numerous other means for alignment.

Figure 16A:
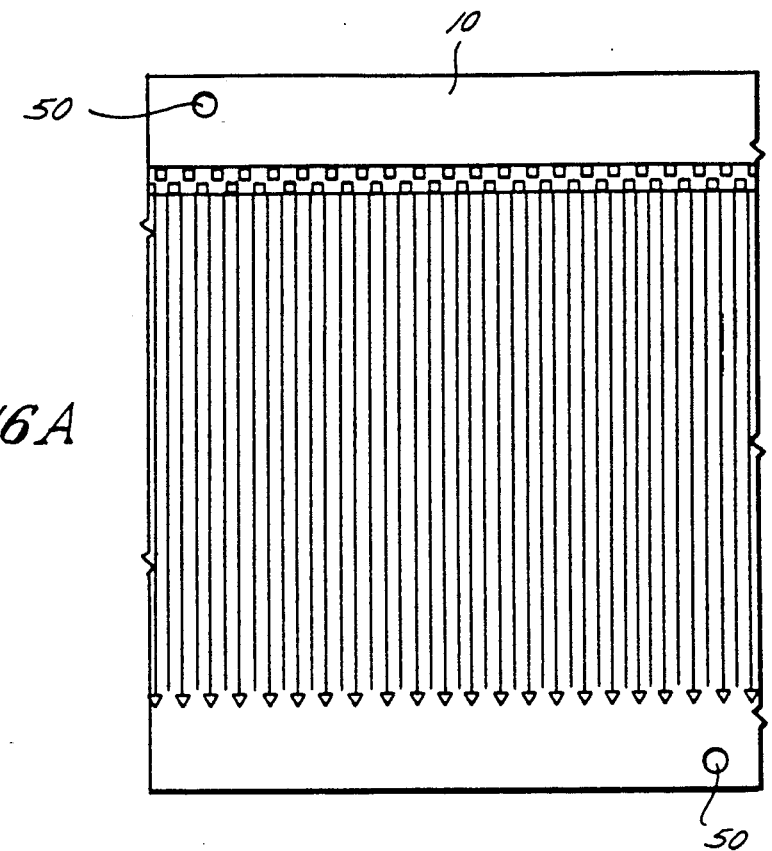
FIGS. 16A and 16B are fragmentary elevational schematic views illustrating various means for aligning the tape.

Referring now to FIG. 16A, holes 50 placed at various locations near the edges of tape 10 can be used for alignment. Mechanical alignment can be accomplished, for example, by placing holes 50 over fixturing pins.

Figure 16B:
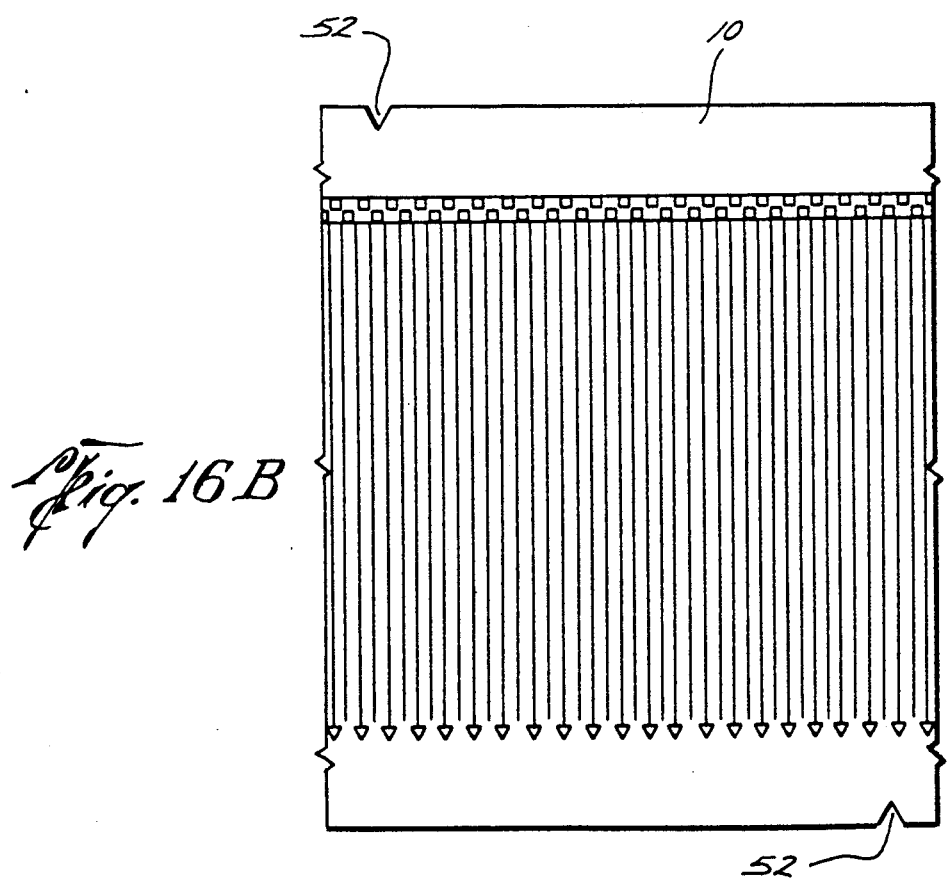

Referring now to FIG. 16B, a unique edge outline of tape 10 can be used as another means for alignment. For instance notches 52 can be formed in the edge of tape 10. Notches 52 can then be mechanically aligned over fixturing pins.

Figure 17:
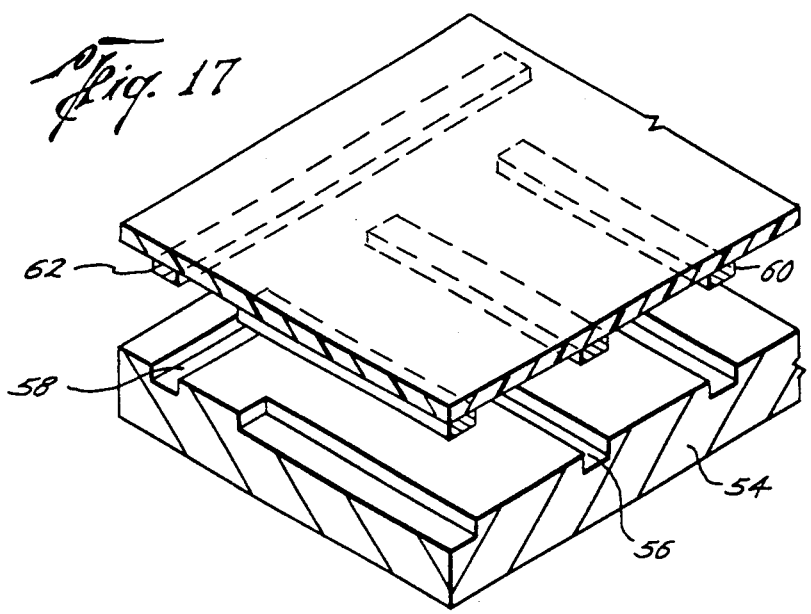
FIG. 17 is a perspective view of a portion of the tape aligning and mating with a base.

Referring now to FIG. 17, another embodiment for alignment is shown. A base 54 has etched grooves 56 and 58 for mating with electrical members 60 and alignment members 62, respectively, on tape 10. Members 60 and 62 are, for instance, narrower in width or diameter than grooves 56 and 58, respectively, so that a secure connection engagement can occur.

Figures 18A, 18B:
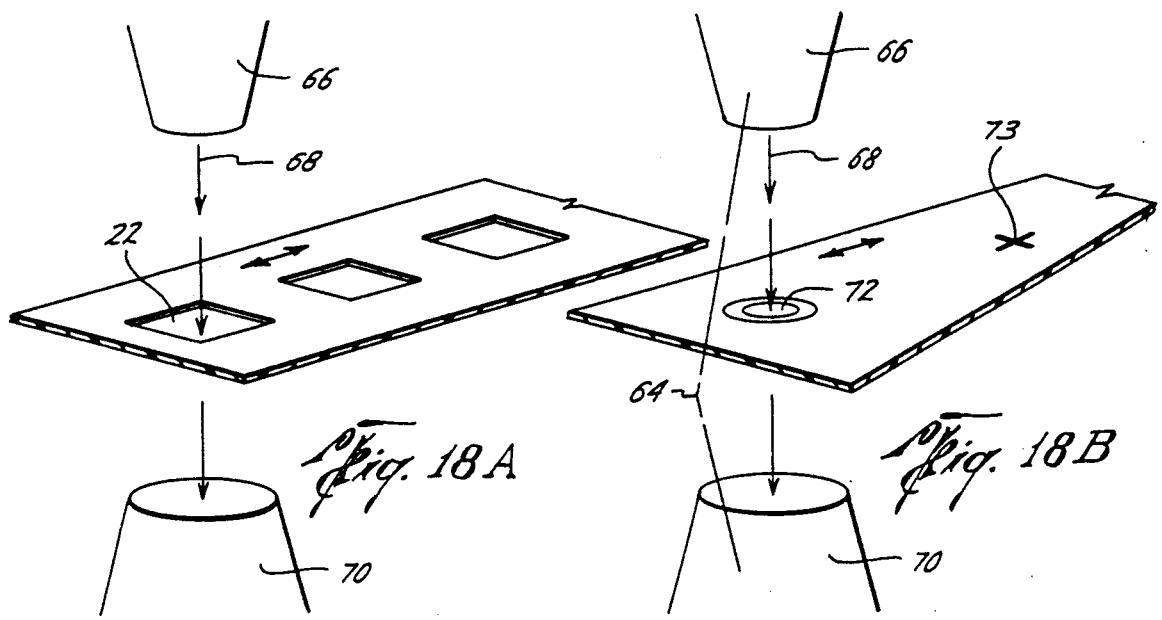
FIGS. 18A and 18B are enlarged fragmentary perspective views of an energy sensing system for aligning the tape.

Referring now to FIGS. 18A and 18B, an energy sensing alignment system 64 is described. An energy source 66 directs an energy beam 68 at an energy sensor 70. Tape 10 can be positioned so that the energy beam 68 is affected by a fiduciary mark and the change is sensed by energy sensor 70. In this embodiment, a system such as a KD-2700 Alignment System by Kaman Instruments Corporation can be used. The KD-2700 uses a conductive metal target near a sensing coil in which the electomagnetic Coupling between each target and its coil is dependent upon the gap therebetween. Numerous types of fiduciary marks on tape 10 can be used as means for alignment with system 64, for example, bulls-eye patterns 72, or cross patterns 73. Other suitable fiduciary marks include openings in the tape 10 that are also capable of permitting mechanical alignment, such as sprocket holes 22, holes 50 or notches 52. Or, if desired, the fiduciary marks can consist of metal traces deposited on the tape 10, or the electrical conductors 12.

Figure 19:
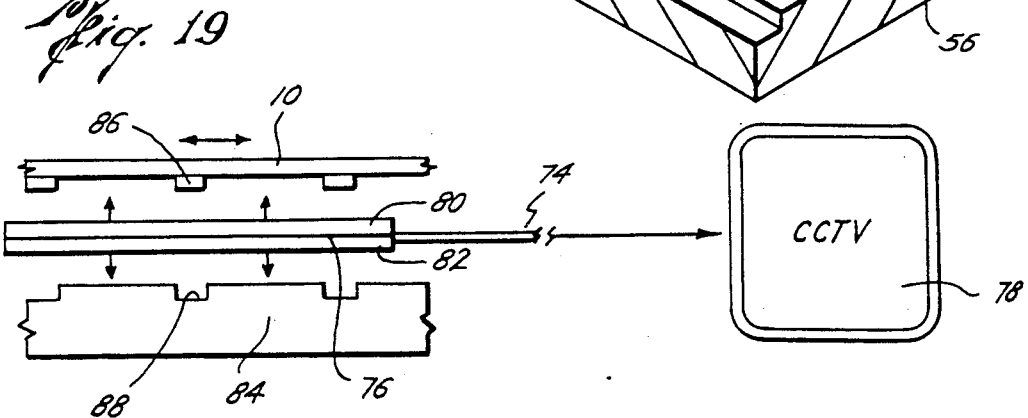
FIG. 19 is an electrical block diagram illustrating an optical image processing system for aligning the tape.

Referring now to FIG. 19, the preferred embodiment for alignment is shown. An optical image processing system 74 comprises a probe 76 and a video monitor 78. The probe 76 includes a first camera 80 and a second camera 82. Cameras 80 and 82 are electronically connected to video monitor 78 as to permit superposition of their respective pictures. Probe 76 is initially positioned such that first camera 80 is focused on tape 10 and second camera 82 is focused on base 84. An operator can then adjust the position of tape 10 until the images of the fiduciary marks 86 on tape 10 and the fiduciary marks 88 on base 84 overlap as viewed on video monitor 78. The optical probe 76 can then be withdrawn to allow the tape 10 and base 84 to be interconnected. Or, if desired, a single camera system (not shown) can be used for front side alignment of tape 10 and base 84. A single camera system may be preferable where the nearest object to the camera, whether tape 10 or base 84, is optically and/or infrared transparent so that both fiduciary marks 86 and 88 appear on video monitor 78. One system, for example, that is suitable for both front and backside alignment is the MAS/500 by Research Devices, a division of American Optical Corporation.

The aforementioned description of various alignment means which may be used in conjunction with the flexible electrical interconnect tape is not meant to be an exhaustive list, and all such conventional alignment means well known to those of skill in the art should be considered to be within the scope of the present invention.

The present invention, therefore, is well suited to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. An electrical interconnect tape for connecting two electrical members comprising,
   a flexible beam lead tape having first and second edges, said tape having a first layer of electrical conductors extending transverse to said edges and having first and second ends, a middle layer of a dielectric material, and a third electrical ground layer, said first ends of the first layer of electrical conductors being adjacent to the first edge and said second ends of the first layer of electrical conductors being adjacent to the second edge,
   vias extending through the dielectric layer at the first and second ends of the first layer of electrical conductors, each of said vias aligned with one of said first layer of electrical conductors,
   an electrical connection between at least one of the ends of the first layer of electrical conductors and the ground layer through a via,
   a raised electrical pad, and
   means for aligning the tape with a substrate to which the tape will be interconnected.

2. The apparatus of claim 1 including a back-up bump extending through the dielectric on the side having the third layer and electrically connected through a via to the raised electrical contact pad.

3. The apparatus of claim 2 wherein the back-up bump is electrically conductive for providing an electrical connection on either side of the tape to said first ends.

4. The apparatus of claim 2 wherein the back-up bump is raised from the tape beyond the third layer.

5. The apparatus of claim 2 wherein the outward extent of the back-up bump is even with the surface of the via.

6. The apparatus of claim 1 wherein the means for alignment include sprocket perforations along the edges of the tape.

7. The apparatus of claim 1 wherein the means for alignment include holes near the edges of the tape.

8. The apparatus of claim 1 wherein the means for alignment include notches in an edge of the tape.

9. The apparatus of claim 1 wherein the means for alignment includes abutments configured to mate with grooves in a substrate and extending from the tape.

10. The apparatus of claim 1 wherein the means for alignment include fiduciary marks on the tape.

11. The apparatus of claim 10 wherein the fiduciary marks comprise bulls-eye patterns.

12. The apparatus of claim 10 wherein the fiduciary marks comprise cross patterns.

13. The apparatus of claim 10 wherein the fiduciary marks comprise metal traces.

14. The apparatus of claim 10 wherein the fiduciary marks comprise the first layer of electrical conductors.

15. The apparatus of claim 10 wherein the fiduciary marks comprise oepnings in the tape.

16. An electrical interconnect tape for connecting two electrical members comprising, a flexible beam lead tape having first and second edges and having a first layer of electrical conductors extending transverse to said edges and having first and second ends, a middle layer of a dielectric material, and a third electrical ground layer, said first ends of the first layer of electrical conductors being adjacent to the first edge and said second ends of the first layer of electrical conductors being adjacent to the second edge, vias extending through the dielectric at the first and second ends of the first layer of electrical conductors, each of said vias aligned with one of said first layer of electrical conductors, a raised electrical pressure actuated contact pad connected to each of the first ends of the first layer of electrical conductors, each raised contact pad being wider than the width of the first layer of electrical conductors, a back-up bump extending through the dielectric to the side having the third layer and electrically connected through a via to each raised electrical contact pad, and means for aligning the tape with a substrate to which the tape will be interconnected.

17. The apparatus of claim 16 wherein the means for alignment include openings in the tape.

18. The apparatus of claim 16 wherein the means for alignment include notches in an edge of the tape.

19. The apparatus of claim 16 wherein the means for alignment include abutments configured to mate with grooves in a substrate and extending from the tape.

20. The apparatus of claim 16 wherein the means for alignment include fiduciary marks.

* * * * *

UNITED STATES PATENT AND TRADEMARK OFFICE
CERTIFICATE OF CORRECTION

PATENT NO. : 5,036,379

DATED : July 30, 1991

INVENTOR(S) : Smith, et al

It is certified that error appears in the above-identified patent and that said Letters Patent is hereby corrected as shown below:

Column 5, line 63, change "Coupling" to --coupling--.

Column 6, line 64, change "pad" to --contact pad connected to each of the first ends of the first layer of electrical conductors--.

Column 7, line 33, change "oepnings" to --openings--.

Signed and Sealed this

Twenty-second Day of December, 1992

Attest:

DOUGLAS B. COMER

*Attesting Officer*  *Acting Commissioner of Patents and Trademarks*